United States Patent [19]

Migliori

[11] 4,326,417

[45] Apr. 27, 1982

[54] NONDESTRUCTIVE ACOUSTIC ELECTRIC FIELD PROBE APPARATUS AND METHOD

[75] Inventor: Albert Migliori, Santa Fe, N. Mex.

[73] Assignee: The United States of America as represented by the United States Department of Energy, Washington, D.C.

[21] Appl. No.: 176,441

[22] Filed: Aug. 8, 1980

[51] Int. Cl.³ .............................................. G01N 29/04
[52] U.S. Cl. ...................................................... 73/601
[58] Field of Search ......................... 73/601, 602, 618; 324/72.5

[56] References Cited

U.S. PATENT DOCUMENTS 3,997,839 12/1976 Dreyfus et al. ..................... 324/72.5

OTHER PUBLICATIONS

Migliori et al., "A Non-destructive Acoustic Electric Field Probe", Los Alamos Scientific Laboratory (La-Ur-79-454), 12/78.

Primary Examiner—Anthony V. Ciarlante
Attorney, Agent, or Firm—Robert W. Weig; Paul D. Gaetjens; Richard G. Besha

[57] ABSTRACT

The disclosure relates to a nondestructive acoustic electric field probe and its method of use. A source of acoustic pulses of arbitrary but selected shape is placed in an oil bath along with material to be tested across which a voltage is disposed and means for receiving acoustic pulses after they have passed through the material. The received pulses are compared with voltage changes across the material occurring while acoustic pulses pass through it and analysis is made thereof to determine preselected characteristics of the material.

10 Claims, 3 Drawing Figures

NONDESTRUCTIVE ACOUSTIC ELECTRIC FIELD PROBE APPARATUS AND METHOD

It is a result of a contract with the Department of Energy (Contract No. W-7405-ENG-36).

BACKGROUND OF THE INVENTION

The invention relates to electric field probe apparatus and methods and more particularly to nondestructive acoustic electric field probes capable of using an acoustic pulse of any shape to determine preselected characteristics of a material.

A recurrent problem in high-voltage engineering is measurement of electric fields inside insulating solids and liquids. The design, longevity and performance of high-voltage systems and their components depends upon accurate knowledge of such electric fields. The considerable effort spent on the determination of these electric fields may be divided into three categories.

A first category comprises modeling using a computer or devices such as electrolytic tanks, resistive paper and sense-electrode arrangements in air or oil. It will be appreciated by those skilled in the art that the knowledge gained is only as accurate as the models themselves, which are often not equipped to deal with unknowns such as space charge, transients and imperfections in the interiors of insulators.

A second category utilizes sense electrodes inside actual systems. This approach damages the device and perturbs the field patterns because it requires holes or other permanent changes in a system under test. Needless to say, this type of testing is of limited usefulness.

A third category encompasses nondestructive probes. For testing thin dielectrics, i.e., those less than about 100 μm thick, several techniques are presently practiced including an electron-beam technique disclosed in Sessler et al., J. of Appl. Phys. 43, 408 (1972), acoustic step-discontinuity measurements as disclosed by Laurenceau et al., Phys. Rev. Lett. 38, 46 (1977), and thermal-pulse measurements as disclosed by both R. E. Collins in the J. Appl. Phys. 47, 4804 (1976) and DeReggi et al., Phys. Rev. Lett. 40, 413 (1978). While the techniques disclosed in these references are viable, they are useful only for measurements of electric fields in thin solid insulators. Non of these techniques lends itself to applications involving large insulating systems of arbitrary geometry or to alternating current measurements. The step-discontinuity acoustic probe of Laurenceau et al. might be applicable to large insulating systems but relies upon detecting the electric potential by utilizing a step-compression acoustic wave to generate an inhomogeneous deformation in an insulating solid. Because the measured quantity is the electric potential, small variations in the electric field of a large system under high electric stress may present almost insurmountable signal to noise problems. Furthermore, the accurate propagation of a step-compressional wave in insulators such as polymethylmethacrylate, polyethylene and other polymers is possible only for very short distances on the order of a few millimeters at best, because of the high attenuation of acoustic waves in these materials. Clearly, implementation of this type of device for large systems would be very difficult.

In practicing the invention, electric fields in insulators are measured utilizing a non-structured acoustic pulse to locally compress the dielectric of interest. Because pulse shape is unimportant in practicing the invention, attenuation effects are easily accomodated to effectively provide a probe range of tens of centimeters in polymers. Because the probe of the invention is sensitive to electric fields, small variations in electric field and space charge are detectable.

SUMMARY OF THE INVENTION

One object of the present invention is to provide measurement of electric fields and/or space charge distribution in solid and liquid insulators and insulating materials of various geometries.

Another object of the invention is to provide nondestructive testing of insulators using an acoustic pulse of arbitrary shape.

In accordance with the present invention there is provided an apparatus and method for nondestructive acoustic electric field and/or space charge distribution measurement. An electric field is produced across an insulating material to be tested. An acoustic pulse having a known shape and amplitude is directed through the material substantially in accordance with the direction of the electric field. The acoustic pulse is received after it has passed through the material to determine its modulation. The resulting time dependent voltage across the material under test is measured. The modulated pulse and the voltage change in the material are then analyzed to determine the preselected characteristics of the material. The insulating material measured can be solid or liquid. The output RC time constant of the effective equivalent circuit of the electric field producing means is greater than the time of flight of the acoustic pulse.

One advantage of the present invention is that an apparatus and method in accordance therewith can nondestructively measure selected properties of both liquid and solid insulating materials of substantial thickness or width.

Another advantage of the present invention is that an acoustic pulse used in accordance therewith may be of arbitrary shape.

Another advantage of the instant invention is that insulating materials measured in accordance therewith may be of various shape and form.

BRIEF DESCRIPTION OF THE DRAWINGS

Other objects and advantages of the present invention will be apparent to those skilled in the art from the following description with reference to the appended drawings wherein like numbers denote like parts and wherein.

DETAILED DESCRIPTION OF A PREFERRED EMBODIMENT OF THE INVENTION

The theory behind the invention, a nondestructive acoustic field probe and method for its use is described in LA-UR-79-454, published by the Los Alamos Scientific Laboratory.

Figure 1:
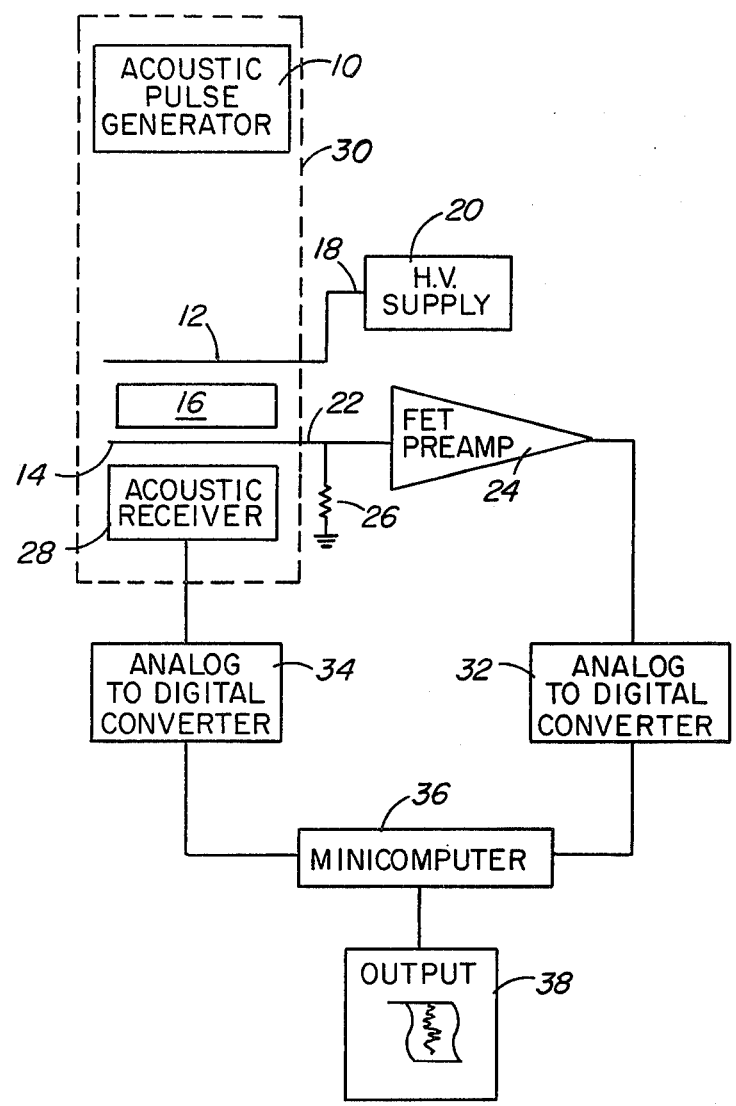
FIG. 1 illustrates in block form a preferred embodiment of the invention.

A preferred embodiment of a nondestructive field probe in accordance with the present invention which is capable of measuring electric fields and space charge distribution inside solid and liquid insulators in a nonperturbing, non-destructive manner is illustrated in FIG. 1. In order for a measurement to be performed, a source of acoustic pulses of known but arbitrary shape should be available, space charge in a material to be measured should be present and/or a voltage across the material to be measured should be either applied or present from another source, and a fast high-input impedance preamplifier should be connected to the material to observe its change in voltage as the acoustic pulses pass through it in a known direction.

As shown in FIG. 1, an acoustic pulse generator 10 is disposed to generate pulses which are passed through an insulating material 16 provided with an electric field thereacross by electrodes 12 and 14. Electrode 12 is supplied with high voltage through a line 18 by a high voltage supply 20. Electrode 14 is connected to a fast, high input impedance (FET) preamplifier 24 through a line 22, grounded through a resistor 26. In a preferred embodiment the acoustic pulse generator 10, the electrodes 12 and 14, material 16 and an acoustic receiver 28 are all located within an oil bath provided schematically by dotted line 30 surrounding these elements. Acoustic receiver 28 connects to an analog to digital converter 34 connected to a minicomputer 36. The output of electrode 14 passes through preamp 24 to a second analog to digital converter 32 and to minicomputer 36. The output of minicomputer 36 is represented by block 38 and will typically be graphical, such as a line chart.

From knowledge of the shape of the acoustic pulse generated and its amplitude, and measurement of that pulse after it has passed through the insulating material, a simple integral equation can be solved for the local internal electric field. This integral equation is derived in previously cited LA-UR-79-454 and is solved by minicomputer 36. That equation is:

$$V_m(t) = -\left(2 - \frac{1}{k}\right) \chi \int_{-\infty}^{\infty} P(ct - z) E(z) \, dz$$

$V_m(t)$ is the time-dependent change in voltage across the insulating material under test, X is the acoustic compressibility of the insulating material, c is the velocity of sound in the insulating material, z is a spatial coordinate, t is time, P(ct-z) is the waveform of the acoustic pulse, E(z) is the electric field inside the insulating material, and k is the ratio of the dielectric constant of the insulating material to the dielectric constant of vacuum.

Figure 2:
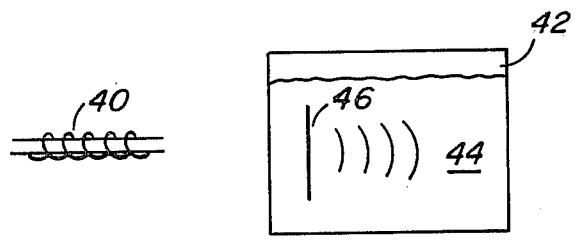
FIG. 2 illustrates an acoustic pulse generator usable in the FIG. 1 embodiment.

The acoustic pulse generator 10 may comprise, for example, as seen in FIG. 2, a ruby laser 40 which transmits light pulses to a sheet of carbon paper 46, comprising, for example, ordinary carbon paper such as used in a typewriter to produce multiple copies. One such carbon paper is identifiable as NU-KOTE, sold by the Burroughs Corporation. Carbon paper 46 is disposed in a liquid 44 which may comprise, for example, trichlorotriflouroethane shown within a container 42. The action of the light pulses on the carbon paper causes it to emit acoustic pulses in accordance therewith.

Figure 3:
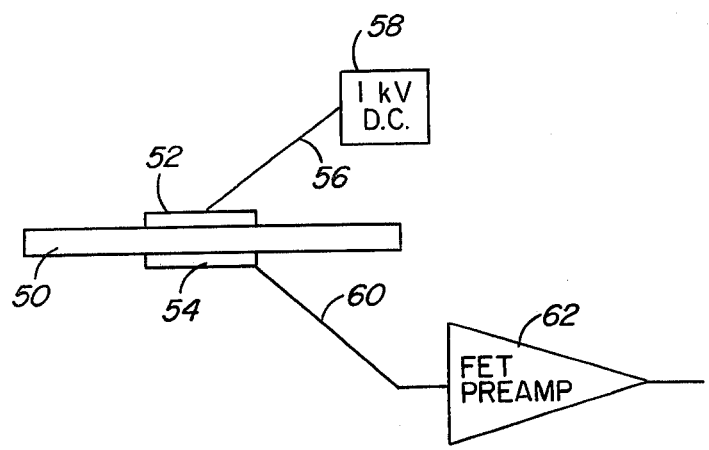
FIG. 3 shows an exemplary structure for measuring space charge distribution in a solid insulator practicing the invention.

FIG. 3 illustrates exemplary structure for measuring a solid insulator 50. Electrodes 52 and 54 are located on either side thereof, electrode 52 being connected through electrical conductor 56 to a source of high voltage 58 such as a 1 kV dc source. Electrode 54 connects through electrical conductor 60 to an FET preamp 62.

In an experimental test acoustic pulses were generated by discharging a 0.2 MFd capacitor charged to 5 kV. The discharge was accomplished by disposing a 5 mm diameter cylindrical copper electrode connected to one terminal of the capacitor a distance just far enough away from the center of a 1 mm disc of aluminum 4 cm in diameter connected to the other terminal of the capacitor to enable the capacitor to just reach 5 kV before the material between the disc and the electrode, which in the experiment was Shell Diala-ax transformer oil, underwent electrical breakdown. The arc occurring at breakdown generated acoustic pulses with bandwidths of about 10 Mhz. These pulses traveled through the oil, through a 1 $\mu$m thick silver electrode evaporated onto the material, through the 12.7 mm thick tetrafluoroethylene material through a second 1 $\mu$m thick evaporated silver electrode, and through the oil again to a pressure transducer. The pulse shape was measured and recorded. The peak pulse pressure used was about $2 \times 10^5$ Pa. During this measurement the first electrode reached by the pulse was connected to a high voltage dc supply whose output time constant was longer than the time required for the acoustic pulse to travel through the tetrafluoroethylene material. This supply was used to generate an electric field of 590 volts per millimeter in the material and, for convenience, was chosen to be direct current although an alternating current could as well have been used. The remaining electrode was grounded through a $10^7$ ohm resistor and connected to an FET preamp. This preamplifier was in turn connected to one channel of a Nicolet Explorer III digital storage oscilloscope. The other channel was connected to the output of the pressure transducer. The Nicolet Explorer III was connected to a Hewlett-Packard HP-9825 minicomputer in which a short HPL program read the data stored by the Nicolet and converted it to the electric field inside the material. With this arrangement, the electric field inside the material was measured within a resolution of about 1 mm and a sensitivity of about 10 volts per mm.

In another experimental test, for improved resolution and sensitivity, a 1.5 joule, 15 nanosecond ruby laser made by Apollo was directed at a section of ordinary carbon paper immersed in fluorochloromenthane and held flat as shown in FIG. 2. The acoustic pulse generated perpendicular to the carbon paper provided a resolution of about 0.05 mm at a sensitivity of 10 volts/mm.

In operation, an insulator to be tested is disposed between electrodes and with an acoustic generator and an acoustic receiver is placed in an immersion tank. A high voltage is supplied to one electrode. Acoustic pulses are generated by the generator, the pulses traveling through the insulator in essentially the same direction as the voltage disposed across it by the electrodes. The acoustic pulses modulated by the insulator are received by an acoustic receiver and, digitized by a digital converter, are transmitted to a minicomputer. Modifications to the electric field across the insulator caused by the acoustic pulses are received by the second electrode and passed through an FET preamp to increase their amplitude to a level usable by the analog to digital converter which receives them and converts them to digital signals which it transmits to the minicomputer. The minicomputer compares signals from the converters and produces an output such as a chart recording which graphically shows space charge distribution or electric fields.

The foregoing description of a preferred embodiment of the invention has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments and with various modifications as are suited to the particular use contemplated. It is intended that the scope of the invention be defined by the claims appended hereto.

What is claimed is:

1. A nondestructive acoustic electric field probe comprising:
   means for producing an electric field having a direction across material to be tested;
   means for generating an acoustic pulse having a known shape and amplitude and for directing it through said material substantially in accordance with the direction of the electric field;
   means for receiving said pulse after it has passed through and been modulated by said material;
   means for determining the voltage across the material while the acoustic pulse passes through it; and
   means for analyzing said acoustic pulse after it has passed through and been modulated by said material and the voltage change on the material during the passage of said acoustic pulse to determine preselected characteristics of said material.

2. The invention of claim 1 wherein said material comprises solid insulating material.

3. The invention of claim 1 wherein said material comprises liquid insulating material.

4. The invention of claim 1 wherein at least one preselected characteristic comprises any electric field present in said material.

5. The invention of claim 1 wherein at least one preselected characteristic comprises space charge distribution in said material.

6. The invention of claim 1 wherein said acoustic pulse comprises an acoustic pulse of any shape.

7. The invention of claim 1 wherein the output RC time constant of the effective equivalent circuit of said electric field producing means is greater than the time it takes of said acoustic pulse to pass through the material.

8. A method for nondestructively testing preselected characteristics of an insulating material comprising:
   producing an electric field in a predetermined direction across material to be tested;
   generating an acoustic pulse having a preselected shape and amplitude;
   directing the acoustic pulse through the material substantially in accordance with the direction of the electric field;
   measuring the voltage across the material while the pulse passes through it;
   receiving the acoustic pulse after it has passed through the material and been modulated thereby;
   analyzing the modulated acoustic pulse and voltage change across the material to determine the preselected characteristics of the material.

9. The invention of claim 8 wherein the preselected characteristics comprise space charge distribution in the material.

10. The invention of claim 8 wherein the acoustic pulse generated and passed through the material is of an arbitrary known shape.

* * * * *